(12) United States Patent
Hayashi

(10) Patent No.: US 6,943,369 B2
(45) Date of Patent: Sep. 13, 2005

(54) SUBSTRATE FOR INTEGRATING AND FORMING A THIN FILM SEMICONDUCTOR DEVICE THEREON

(75) Inventor: Hisao Hayashi, Kanagawa (JP)

(73) Assignee: Sony Corporation (JP)

( * ) Notice: Subject to any disclaimer, the term of this patent is extended or adjusted under 35 U.S.C. 154(b) by 461 days.

(21) Appl. No.: 09/808,957

(22) Filed: Mar. 16, 2001

(65) Prior Publication Data

US 2001/0022362 A1 Sep. 20, 2001

(30) Foreign Application Priority Data

Mar. 17, 2000 (JP) ...................................... P2000-075755

(51) Int. Cl.[7] .......................... H01L 35/24; H01L 51/00
(52) U.S. Cl. .............................. 257/40; 257/59; 257/72
(58) Field of Search ............................. 257/40, 59, 72, 257/83, 642; 438/455, 459, 977

(56) References Cited

U.S. PATENT DOCUMENTS

| | | | | |
|---|---|---|---|---|
| 5,189,549 A | * | 2/1993 | Leventis et al. ............. 359/271 |
| 5,208,690 A | * | 5/1993 | Hayashi et al. ............... 359/59 |
| 5,376,561 A | * | 12/1994 | Vu et al. ..................... 438/118 |
| 5,384,069 A | * | 1/1995 | Yoshinaga et al. ..... 252/299.01 |
| 5,475,515 A | * | 12/1995 | Yoshinaga et al. ............ 359/52 |
| 5,476,810 A | * | 12/1995 | Curran ......................... 437/86 |
| 5,540,858 A | * | 7/1996 | Yoshinaga et al. ..... 252/299.01 |
| 5,585,951 A | * | 12/1996 | Noda et al. .................. 349/122 |
| 5,830,542 A | * | 11/1998 | Shigeno .......................... 428/1 |
| 5,940,154 A | * | 8/1999 | Ukita et al. .................. 349/113 |
| 6,049,106 A | * | 4/2000 | Forbes ......................... 257/329 |
| 6,057,234 A | * | 5/2000 | Yamazaki ..................... 438/660 |
| 6,067,135 A | * | 5/2000 | Shimizu et al. ............... 349/86 |
| 6,157,426 A | * | 12/2000 | Gu ............................... 349/111 |
| 6,198,464 B1 | * | 3/2001 | Ota et al. ....................... 345/77 |
| 6,218,702 B1 | * | 4/2001 | Yamazaki et al. ........... 257/347 |
| 6,458,613 B1 | * | 10/2002 | Bae ............................... 438/30 |
| 2002/0164535 A1 | * | 11/2002 | Hoffend, Jr. et al. ......... 430/20 |

FOREIGN PATENT DOCUMENTS

| | | | | |
|---|---|---|---|---|
| JP | 11265155 | * | 3/1998 | ......... G02F/1/1343 |
| KR | 2001066348 | * | 12/1999 | ............. G02F/1/13 |

* cited by examiner

Primary Examiner—Mary Wilczewski
Assistant Examiner—Monica Lewis
(74) Attorney, Agent, or Firm—Rader, Fishman & Grauer PLLC; Ronald P. Kananen

(57) ABSTRACT

Substrates suitable to manufacture and products of a thin film semiconductor device are provided, by at first preparing a manufacturing substrate having a characteristic capable of enduring a process for forming a thin film transistor and a product substrate having a characteristic of being suitable to direct mounting of the thin film transistor in a preparatory step, then applying a bonding step to bond the manufacturing substrate to the product substrate for supporting the product substrate at the back, successively applying a formation step to form at least a thin film transistor to the surface of the product substrate in a state reinforced with the manufacturing substrate and, finally, applying a separation step to separate the manufacturing substrate after use from the product substrate.

25 Claims, 4 Drawing Sheets

SUBSTRATE FOR INTEGRATING AND FORMING A THIN FILM SEMICONDUCTOR DEVICE THEREON

BACKGROUND OF THE INVENTION

1. Field of the Invention

This invention relates to a thin film semiconductor device and a manufacturing method thereof. More specifically, it relates to a constitution of a substrate for integrating and forming a thin film transistor thereon.

2. Description of the Related Art

Generally, in a thin film semiconductor device, a thin film transistor is integrated and formed on an insulation substrate, for example, made of glass. The thin film transistor has to be formed through steps, such as CVD (Chemical Vapor Deposition), cleaning and heat treatment. Since different steps are successively applied, the substrate has to be transported between the stages for each of the processes. If the substrate is deformed, such as by warping, automatic transportation using a manipulator is not possible. Therefore, a substrate for use in the thin film semiconductor device requires heat resistance capable of enduring the temperature for forming the thin film transistor. Further, it is necessary for a thickness of a predetermined level or more, so as not to cause warping deformation during transportation.

On the other hand, products using the thin film semiconductor device as a component can include, for example, an active matrix type liquid crystal display. When a liquid crystal display is used for portable equipment, the thin film semiconductor device is required for a structure reduced in weight and of less fracture. Therefore, manufacturing conditions required for the substrate and conditions for the products do not often agree with each other, and there is a market complaint against the products. As described above, use of glass for the substrate is suitable in view of the manufacturing conditions such as heat resistance. However, in view of the product conditions, the glass substrate has a drawbacks of heavy weight and easy cracking. For the liquid display used in portable electronic equipment, such as palm-top computers or portable telephones, it is desirable for the material to have a cost that is as low as possible, to be reduced in the weight, to endure some deformation and to crack less upon dropping. Actually, the glass substrate is heavy, sensitive to deformation and likely to be broken by dropping. That is, there is a difference between restrictions due to manufacturing conditions and preferred characteristics required for the products, and it is difficult to satisfy both of the conditions or characteristics, and this is left still unresolved.

Various countermeasures have been proposed so far in order to overcome such problems. For example, it has been attempted to use a plastic substrate, for example, by lowering the process temperature for the thin film transistor as much as possible. However, the plastic substrate suffers from a larger deformation compared with the glass substrate, and no satisfactory products have been obtained at present (N. D. Young, et al., Euro Display '96 Digest, 555, 1996). Further, there has been proposed a countermeasure of once forming a thin film transistor to a provisional substrate and then transferring the same to another substrate which is disclosed, for example, in Japanese Published Unexamined Patent Application Hei 11-243209. However, this method is complicated in the transfer step and involves a problem in view of the productivity. Further, since the provisional substrate used for forming the thin film transistor and a substrate for mounting the thin film transistor as a product are different, characteristic are liable to fluctuate in the thin film transistor in view of the problems, such as stresses and the like.

SUMMARY OF THE INVENTION

For overcoming the foregoing problems in the prior art, this invention provides a method of manufacturing a thin film semiconductor device comprising:

a preparatory step of preparing a manufacturing substrate having the characteristic of being capable of enduring the process for forming a thin film transistor and a product substrate having the characteristic of being suitable to direct mounting of the thin film transistor;

a bonding step of bonding the manufacturing substrate to the product substrate for supporting the product substrate at the back;

a formation step of forming at least a thin film transistor to the surface of the product substrate in a state reinforced with the manufacturing substrate; and a separation step of separating the manufacturing substrate after use from the product substrate.

Preferably, in the preparatory step, a manufacturing substrate made of an inorganic material and a product substrate made of an organic material are prepared. Optionally, in the formation step, a moisture proof film is formed on the surface of a product substrate made of an organic material and then a thin film transistor is formed thereon. Further, in the bonding step, the manufacturing substrate is bonded to the product substrate by using adhesives coated in the releasable manner.

Further, this invention provides a method of manufacturing a liquid crystal display device comprising:

a preparatory step of preparing a manufacturing substrate having the characteristic of being capable of enduring a process for forming a thin film transistor and a product substrate having the characteristic of being suitable to direct mounting of the thin film transistor;

a bonding step of bonding the manufacturing substrate to the product substrate for supporting the product substrate at the back;

a formation step of forming at least a thin film transistor and a pixel electrode to the surface of the product substrate in a state reinforced with the manufacturing substrate:

a separation step of separating the manufacturing substrate after use from the product substrate; and an assembling step of joining an opposing substrate previously formed with opposing electrodes at a predetermined distance to the product substrate formed with the pixel electrodes before or after the separation step, and injecting liquid crystals in the gap.

Furthermore, this invention provides a method of manufacturing an electroluminescence display device comprising:

a preparatory step of preparing a manufacturing substrate having the characteristic capable of enduring a process for forming a thin film transistor and a product substrate having the characteristic suitable to direct mounting of the thin film transistor;

a bonding step of bonding the manufacturing substrate to the product substrate for supporting the product substrate at the back;

a formation step of forming at least a thin film transistor and an electroluminescence device to the surface of the product substrate in a state reinforced with the manufacturing substrate; and a separation step of separating the manufacturing substrate after use from the product substrate.

According to this invention, in the preparatory step before forming the thin film transistor, a manufacturing substrate, for example, made of glass is previously appended to a product substrate, for example, made of a plastic material for reinforcement. Subsequently, a thin film transistor is integrated and formed on a product substrate made, for example, of a plastic material. In this case, since the product substrate made, for example, of a plastic material or the like is backed by the manufacturing substrate made, for example of glass, it has a rigidity as a whole capable of enduring the transportation by manipulators. Then, at the instance the manufacturing process for the thin film transistor has been completed, the manufacturing substrate after use is separated from the product substrate. Finally, the thin film transistor is supported only by a thin and lightweight product substrate. An active matrix type liquid crystal display using a plastic substrate is suitable to the application use to the portable equipment.

DESCRIPTION OF THE PREFERRED EMBODIMENTS

Figure 1A:
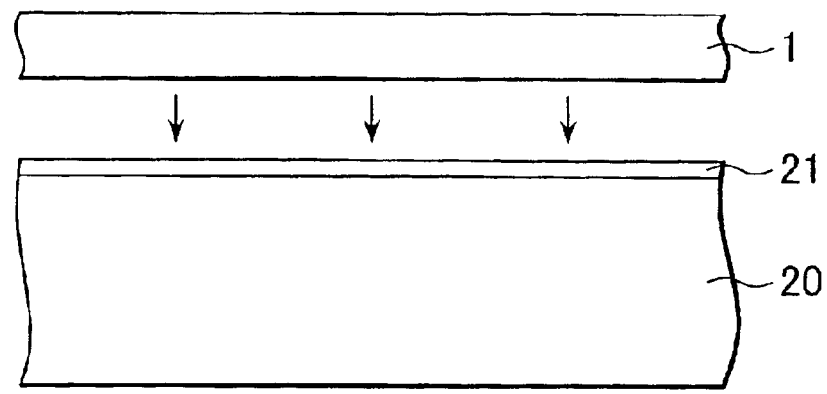
FIGS. 1A and 1B are step charts illustrating a method of manufacturing a thin film semiconductor device according to this invention.
Figure 1B:
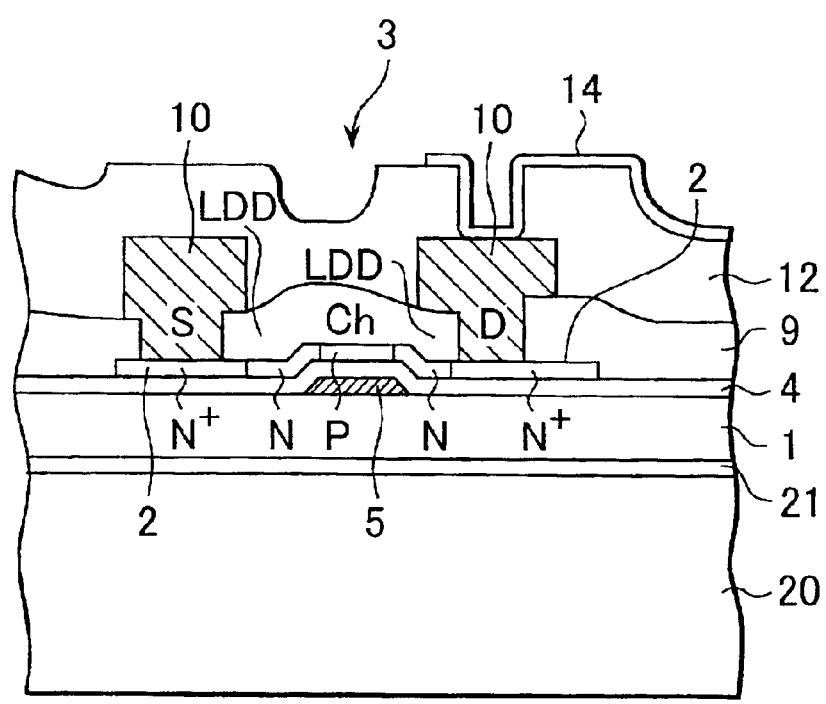

Preferred embodiments of this invention are to be described in detail with reference to the drawings. FIGS. 1A and 1B are an example of schematic step charts illustrating a method of manufacturing a thin film semiconductor device according to this invention. At first, as shown in FIG. 1A, a manufacturing substrate 20 having characteristics durable to the process for forming a thin film transistor and a product substrate 1 having characteristics suitable to direct mounting of a thin film transistor are prepared. In the preparatory step, a manufacturing substrate 20, for example, made of an inorganic material, such as glass, and a product substrate 1 made of an organic material, such as plastic, are prepared. In this embodiment, non-alkali glass is used as the manufacturing substrate 20. The heat resistance of the non-alkali glass is about 500° C. The standard thickness for the manufacturing substrate 20 is, for example, 0.7 mm. If it is reduced to 0.5 mm, there is no particular problem in view of the manufacturing process. In this embodiment, non-alkali glass is used but, instead, metal plate, such as of stainless steel, plastic plate, quartz and the like, can be also be used.

On the other hand, for the product substrate 1, it is necessary to have a heat resistance capable of withstanding the processing temperature of a thin film transistor, and it is necessary that the product substrate 1 is thinner and lighter compared with the manufacturing substrate 20. In this embodiment, a plastic material is used with a thickness from about 0.1 mm to 0.5 mm. Particularly, polyether sulfone resin (PES), polyethylene terephthalate resin or ARTON resin of excellent heat resistance is used. The polyether sulfone resin has a heat resistance as high as about 250° C. The plastic film used for the product substrate 1 may be a single layer and, depending on the case, has a laminate structure. Particularly, when this is used for a reflection type display and not a transmission type display, a metal plate can be used instead of the plastic material. However, when the metal plate is used for the product substrate 1, the surface has to be insulated. For example, when an aluminum plate is used for the product substrate 1, the surface has to be previously covered with alumina.

Successively, as shown in FIG. 1A, the manufacturing substrate 20 is bonded to the product substrate 1 in order to support the product substrate 1 at the back. In the bonding step, the manufacturing substrate 20 is bonded to the product substrate 1 by using an adhesive 21 coated, for example, in a releasable state. In this embodiment, a heat resistant resin is coated as the adhesive 21. Since the resin has to endure heat upon forming the thin film transistor, a polyimide, silicon or TEFLON-type resin is used (TEFLON is a trademark of DuPont). However, when the processing temperature for the thin film transistor is lowered, various adhesives can be used. Coating is conducted by spin coating or printing a liquid material. Instead, there is a method of appending a film-shaped adhesive to one of the substrate surfaces and then coating by heat melting the same. The adhesive 21 is not restricted only to organic material, but silicon, germanium and, further, metal (lead, aluminum, molybdenum, nickel or tin) may also be used. When such a material is used, it is formed as a film by a sputtering or the like to one of the substrates and bonded to the other of the substrates while being melted under laser irradiation or the like. In the case of using an aluminum plate as the product substrate 1, a product substrate 1 made of aluminum or the like and a manufacturing substrate 20 made of glass can be bonded directly by using optical energy, such as that of laser.

Successively, as shown in FIG. 1B, a thin film device, such as a thin film transistor 3, is integrated and formed on the surface of the product substrate 1 in a state reinforced with the manufacturing substrate 20. Specifically, after forming film of a metal, such as tantalum or molybdenum, by a sputtering method or the like at first, it is patterned by isotropic dry etching to fabricate into a gate electrode 5. Successively, SiO2 is deposited, for example, to a thickness of 100 to 200 nm by a plasma CVD method (PE-CVD method) to form a gate insulation film 4 for covering the gate electrode 5. Amorphous silicon is deposited further thereon to a thickness, for example, of 20 to 60 nm to form a semiconductor thin film 2. The insulation film 4 and the semiconductor thin film 2 can be grown continuously without breaking vacuum in one identical film forming chamber. Subsequently, the semiconductor thin film 2 is crystallized, for example, by irradiating an XeCl excimer laser beam at a wavelength of 308 nm for an extremely short period of time. The amorphous silicon is melted by the energy of the laser beam and forms polycrystal silicon when solidified. Since the irradiation time of the laser beam is extremely short, it causes no damages to the product substrate 1. Subsequently, resist is coated on the semiconductor thin film 2 and back-face exposure is applied by using a light shielding gate electrode 5 as a mask to obtain a mask aligned with the gate electrode 5 in self-alignment. Then, impurities (for example, phosphorus) are implanted by way of the mask by an ion-doping method into the semiconductor thin film 2 at a relatively low concentration. Further, after covering the mask and the peripheral thereof with another photoresist, impurities (for example, phosphorus) are implanted at a relatively high concentration by an ion doping method to the semiconductor thin film 2. A source region S and a drain region D are thus formed. Further, a channel region Ch previously implanted with P-type impurities (for example, boron) for threshold value control is left just above the gate electrode 5. Between the channel region Ch and the source region S or the drain region D, an LDD region implanted with N-type impurities, such as phosphorus, at a relatively low concentration is left. Subsequently, unnecessary photoresist is removed. The ion-doping method is a method of doping ions in a plasma state under electric field acceleration all at once into the semiconductor thin film 2 that enables short time processing. Successively, a laser beam is irradiated again for activating the doped atoms. This is the same method as for crystallization, but a weak energy may suffice since there is no requirement for growing the crystals. Then, SiO2, for example, is deposited to form an interlayer film 9 for insulation between interconnections. After making a contact hole in the interlayer film 9, metal aluminum or the like is deposited by sputtering, patterned to a predetermined shape and fabricated into interconnections 10. In the subsequent procedures, in a case of manufacturing a thin film semiconductor device for use in an active matrix type liquid crystal display, a protection film 12 or a pixel electrode 14 is formed optionally. Further, an assembling step is applied by bonding an opposing substrate previously formed with opposing electrodes to the product substrate formed with the pixel electrode 14 at a predetermined distance and injecting liquid crystals into the gap. On the other hand, in the case of using the thin film semiconductor device for an active matrix type organic electroluminescence display, an organic electroluminescence device is previously formed on the pixel electrode 14.

Figure 2:
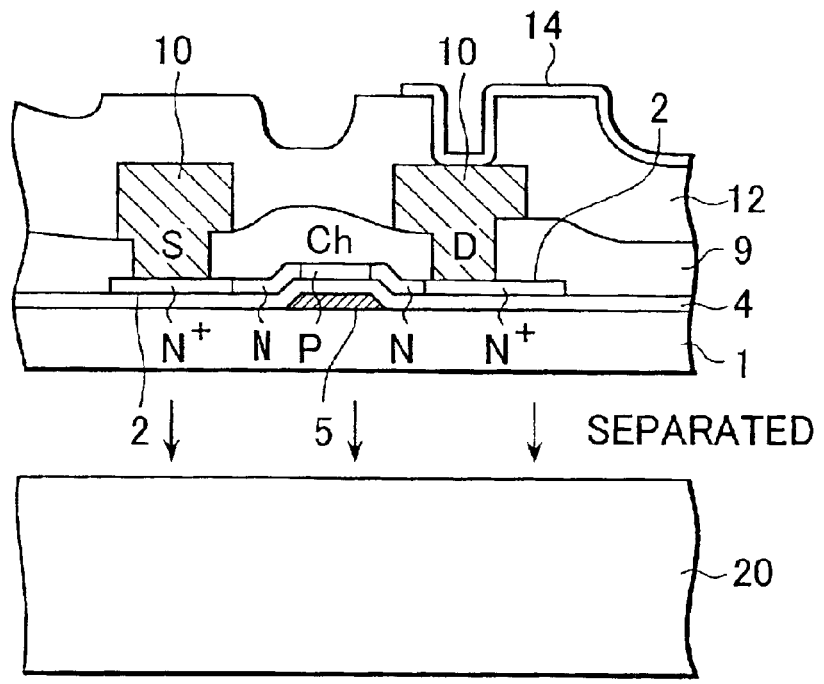
FIG. 2 is a step chart illustrating a method of manufacturing a thin film semiconductor device according to this invention.

Finally, as shown in FIG. 2, a separation step of separating the used manufacturing substrate 20 from the product substrate 1 is applied. Specifically, both of the substrates can be separated by dissolving adhesives interposed between the manufacturing substrate 20 and the product substrate 1 in a solvent. The solvent used is different depending on the material of the adhesives. Generally, the adhesive layer is extremely thin and takes much time until the solvent intrudes. Then, it is effective to promote the dissolution of the adhesives by using energy, such as supersonic waves or laser beams. In the previous bonding step, it is not necessary to uniformly coat the adhesive over the entire surface of the substrate. Rather, dissolution using the solvent is facilitated by coating the adhesives discretely. As described above, since only the product substrate 1 made of the plastic material or the like is left to the final product, a display light in weight and reduced in the thickness can be obtained. In the case of preparing a liquid crystal display, the assembling step described above may be applied after separation of the manufacturing substrate 20.

Figure 3:
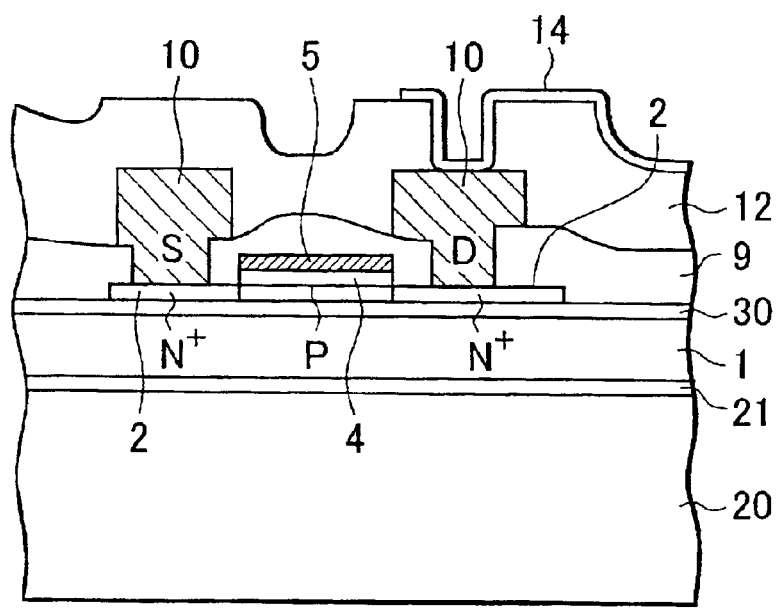
FIG. 3 is a fragmentary cross-sectional view illustrating another embodiment of a thin film semiconductor device according to this invention.

In the embodiment described above, a thin film transistor of the bottom gate structure has been formed on the product substrate 1. Instead, a thin film transistor of a top gate structure may also be integrated and formed. FIG. 3 shows this embodiment. For easy understanding, corresponding reference numerals are attached to those portions corresponding to the previous embodiment shown in FIG. 1 and FIG. 2. As shown in the drawing, in the thin film transistor of the top gate structure, the gate electrode 5 is formed by way of the gate insulation film 4 on the semiconductor thin film 2. In this embodiment, a moisture proof buffer film 30 is formed between the product substrate 1 and the thin film transistor. The buffer film 30 comprises a silicon oxide film or a silicon nitride film formed by a chemical vapor deposition (CVD) or sputtering method, which stops water passing through the product substrate 1 and suppresses impurities from intruding into the product substrate 1. In the case of using a plastic material for the product substrate 1, it is sometimes preferred to form a buffer film particularly as a moisture proof countermeasure.

Figure 4:
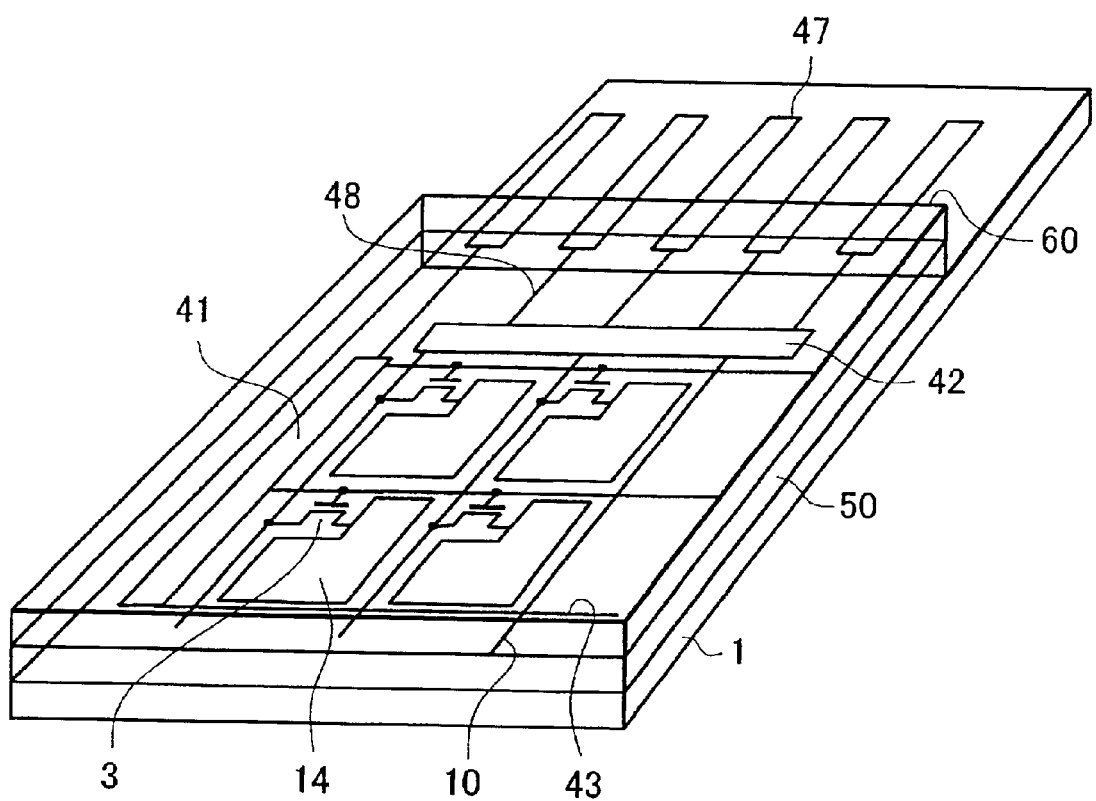
FIG. 4 is a perspective view illustrating a liquid crystal display device according to this invention.

FIG. 4 is a schematic perspective view illustrating an example of an active matrix type liquid crystal display device assembled by using a thin film semiconductor device according to this invention as a driving substrate. The liquid crystal display device has a panel structure of possessing liquid crystals 50 between a product substrate 1 and an opposed substrate 60. A pixel array area and a peripheral circuit area are integrated and formed by the same thin film transistor as described above on the product substrate 1. The peripheral circuit area is divided into a vertical scanning circuit 41 and a horizontal scanning circuit 42. Further, terminal electrodes 47 for external connection are also formed on the upper end of the product substrate 1. Each of the terminal electrode 47 is connected by way of interconnections 48 to the vertical scanning circuit 41 and the horizontal scanning circuit 42. Gate interconnections 43 and signal interconnections 10 crossing to each other are formed in the pixel array area. The gate electrode 43 is connected with the vertical scanning circuit 41 while the signal interconnection 10 is connected with the horizontal scanning circuit 42. A pixel electrode 14 and a thin film transistor 3 for driving the same are formed at the intersection between both of the interconnections 43 and 10. On the other hand, counter electrodes are formed although not illustrated to the inner surface of the opposing substrate. When plastic material is used for the product substrate 1 and identical plastic material is used as the opposing substrate 60, a panel extremely light in weight and resistant to damages can be obtained.

Figure 5:
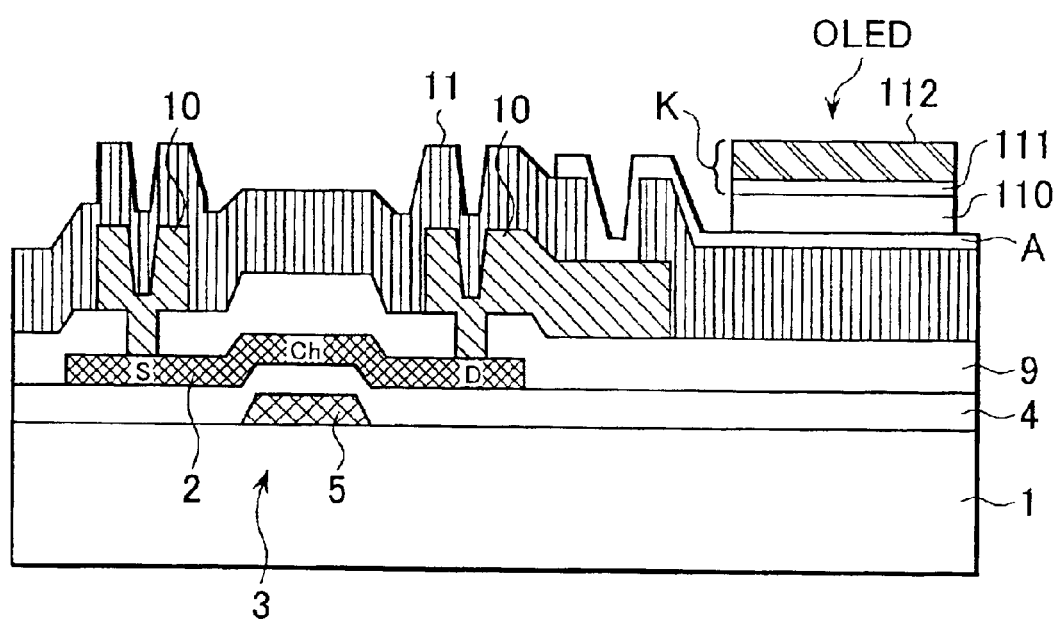
FIG. 5 is a schematic cross-sectional view illustrating an electroluminescence display device according to this invention.

FIG. 5 is a schematic fragmentary cross sectional view illustrating an active matrix type electroluminescence display device assembled using a thin film semiconductor device according to this invention as a driving substrate. In this embodiment, an organic electroluminescence device OLED is used as a pixel. The OLED comprises an anode A, an organic layer 110 and a cathode K stacked successively. The anode A is isolated on every pixel made, for example, of chromium and basically light reflecting. The cathode K is connected in common between each of the pixels, has a laminate structure, for example, of a metal layer 111 and a transparent conduction layer 112 and is basically light permeable. When a forward voltage (at about 10 V) is applied between the anode A and the cathode K of the OLED of such a structure, injection of carriers such as electrons or positive holes occurs and light emission is observed. It is considered that the operation of the OLED is light emission caused by exciters formed with holes injected from the anode A and electrons injected from the cathode K.

On the other hand, a thin film transistor 3 for driving the OLED comprises a gate electrode 5 formed on a product substrate 1 made, for example, of a plastic material, a gate insulation film 4 stacked thereon and a semiconductor thin film 2 stacked above the gate electrode 5 by way of the gate insulation film 4. The semiconductor thin film 2 comprises, for example, a silicon thin film crystallized by laser annealing. The thin film transistor 3 comprises a source region S, a channel region Ch and a drain region D as a passage for the current supply to the OLED. The channel region Ch situates just above the gate electrode 5. The thin film transistor 3 having the bottom gate structure is covered with an interlayer film 9, on which interconnections 10 are formed. The film of the OLED described above is formed on them by way of another interlayer film 11. The anode A of the OLED is electrically connected by way of the interconnections 10 to the thin film transistor 3.

As has been described above, this invention comprises a structure in which a manufacturing substrate having the characteristic of being able to endure the process for forming the thin film transistor and a product substrate having the characteristic of being suitable to direct mounting of the thin film transistor are used, the manufacturing substrate is bonded to the product substrate for supporting the product substrate at the back, at least the thin film transistor is formed on the surface of the product substrate in a state reinforced with the manufacturing substrate, and the manufacturing substrate after use is separated from the product substrate. In the manufacturing steps, since the thin film transistor is integrated and formed on the substrate reinforced with bonding, handling for the substrate, etc. can be facilitated to contribute to the stabilization of the process. On the other hand, since the manufacturing substrate after use is separated in a stage where the product is completed, the product itself is reduced in weight and thickness. In addition, the separated manufacturing substrate can further be utilized again in the thin film transistor manufacturing process, making it possible for recycling of resources.

What is claimed is:

1. A thin film semiconductor device comprising:
   product substrate and a thin film device,
   wherein a manufacturing substrate is of an inorganic material,
   wherein said product substrate is one of an organic material and a metal,
   wherein said product substrate has a first side and a second side opposed to said first side,
   wherein said manufacturing substrate is adjacent said first side, said manufacturing substrate being closer to said first side than to said second side,
   wherein an adhesive layer is formed between said first side and said manufacturing substrate,
   wherein said thin film device is adjacent said second side, said thin film device being closer to said second side than to said first side,
   wherein said product substrate is between said thin film device and said manufacturing substrate, and
   wherein said manufacturing substrate is removable for exposing said first side by leaving said product substrate and said thin film device.

2. A thin film semiconductor device as claimed in claim 1, wherein said manufacturing substrate is a glass substrate.

3. A thin film semiconductor device as claimed in claim 1, wherein said thin film device is a thin film transistor.

4. A thin film semiconductor device as claimed in claim 1, wherein said metal is aluminum.

5. A thin film semiconductor device as claimed in claim 1, wherein said organic material is a plastic.

6. A thin film semiconductor device as claimed in claim 5, wherein a moisture-proof buffer film is formed between said second surface and said thin film device.

7. A thin film semiconductor device as claimed in claim 5, wherein said plastic is from the group comprising polyether sulfone resin, polyethylene terephthalate resin and ARTON resin.

8. A thin film semiconductor device as claimed in claim 1, wherein said adhesive layer is from the group comprising a polyimide, Teflon resin, silicon, germanium and metal.

9. A liquid crystal display device comprising:
   product substrate and a pixel array,
   wherein a manufacturing substrate is of an inorganic material,
   wherein said product substrate is one of an organic material and a metal,
   wherein said product substrate has a first side and a second side opposed to said first side,
   wherein said manufacturing substrate is adjacent said first side, said manufacturing substrate being closer to said first side than to said second side,
   wherein an adhesive layer is formed between said first side and said manufacturing substrate,
   wherein said pixel array is adjacent said second side, said pixel array being closer to said second side than to said first side,
   wherein said product substrate is between said pixel array and said manufacturing substrate, and
   wherein said manufacturing substrate is removable for exposing said first side by leaving said product substrate and said pixel array.

10. A liquid crystal display device as claimed in claim 9, wherein said manufacturing substrate is a glass substrate.

11. A liquid crystal display device as claimed in claim 9, wherein said metal is aluminum.

12. A liquid crystal display device as claimed in claim 9, wherein said organic material is a plastic.

13. A liquid crystal display device as claimed in claim 12, wherein a moisture-proof buffer film is formed between said second surface and said pixel array.

14. A liquid crystal display device as claimed in claim 12, wherein said plastic is from the group comprising polyether sulfone resin, polyethylene terephthalate resin and ARTON resin.

15. A liquid crystal display device as claimed in claim 9, wherein said adhesive layer is from the group comprising a polyimide, Teflon resin, silicon, germanium and metal.

16. A electroluminescence display device comprising:
    product substrate and an electroluminescence device,
    wherein a manufacturing substrate is of an inorganic material,
    wherein said product substrate is one of an organic material and a metal,
    wherein said product substrate has a first side and a second side opposed to said first side,
    wherein said manufacturing substrate is adjacent said first side, said manufacturing substrate being closer to said first side than to said second side,
    wherein said electroluminescence device is adjacent said second side, said electroluminescence device being closer to said second side than to said first side,
    wherein an adhesive layer is formed between said first side and said manufacturing substrate,
    wherein said product substrate is between said electroluminescence device and said manufacturing substrate, and
    wherein said manufacturing substrate is removable for exposing said first side by leaving said product substrate and said electroluminescence device.

17. A electroluminescence display device as claimed in claim 16, wherein said manufacturing substrate is a glass substrate.

18. A electroluminescence display device as claimed in claim 16, wherein said metal is aluminum.

19. A electroluminescence display device as claimed in claim 16, wherein said organic material is a plastic.

20. A electroluminescence display device as claimed in claim 19, wherein a moisture-proof buffer film is formed between said second surface and said electroluminescence device.

21. A electroluminescence display device as claimed in claim 19, wherein said plastic is from the group comprising polyether sulfone resin, polyethylene terephthalate resin and ARTON resin.

22. A electroluminescence display device as claimed in claim 16, wherein said adhesive layer is from the group comprising a polyimide, Teflon resin, silicon, germanium and metal.

23. A thin film semiconductor device as claimed in claim 1, wherein said adhesive layer is dissolvable to remove said manufacturing substrate.

24. A liquid crystal display device as claimed in claim 9, wherein said adhesive layer is dissolvable to remove said manufacturing substrate.

25. A electroluminescence display device as claimed in claim 16, wherein said adhesive layer is dissolvable to remove said manufacturing substrate.

* * * * *